(12) United States Patent
Zhao et al.

(10) Patent No.: US 7,658,991 B2
(45) Date of Patent: Feb. 9, 2010

(54) STRUCTURES HAVING ALIGNED NANORODS AND METHODS OF MAKING

(75) Inventors: Yiping Zhao, Statham, GA (US); Jianguo Fan, Athens, GA (US)

(73) Assignee: University of Georgia Research Foundation, Inc., Athens, GA (US)

( * ) Notice: Subject to any disclaimer, the term of this patent is extended or adjusted under 35 U.S.C. 154(b) by 647 days.

(21) Appl. No.: 11/256,395

(22) Filed: Oct. 21, 2005

(65) Prior Publication Data
US 2007/0166539 A1 Jul. 19, 2007

Related U.S. Application Data

(60) Provisional application No. 60/620,810, filed on Oct. 21, 2004.

(51) Int. Cl.
*B32B 5/16* (2006.01)
(52) U.S. Cl. .................. 428/323; 428/403; 977/890
(58) Field of Classification Search ............... 428/403, 428/323; 977/890
See application file for complete search history.

(56) References Cited

U.S. PATENT DOCUMENTS

| | | | |
|---|---|---|---|
| 6,180,415 B1 | 1/2001 | Schultz et al. | 436/518 |
| 6,221,154 B1 * | 4/2001 | Lee et al. | 117/87 |
| 6,376,177 B1 | 4/2002 | Poponin | 435/6 |
| 6,401,526 B1 * | 6/2002 | Dai et al. | 73/105 |

FOREIGN PATENT DOCUMENTS

| | | |
|---|---|---|
| EP | 0 261 642 | 9/1987 |
| WO | WO 2006/005111 | 1/2006 |
| WO | WO 2006/066180 | 6/2006 |
| WO | 2006/137885 | 12/2006 |
| WO | WO 2007/135593 A1 | 11/2007 |

OTHER PUBLICATIONS

Zhao et al, Enhancing the Sensitivity and Stability of Biosensors by Novel Nanostructures, 2004. 1-3.*
Science, vol. 319, p. 1163; Materials Science/A Graded Improvement; Adv. Mater, 20, pp. 801- 804; (2008).
K. Robbie, et al.; Sculptured Thin Films and Glancing Angle Deposition: Growth Mechanics and Applications; J. Vac. Sci. Technol. A 15 (3), May/Jun. 1997; pp. 1460-1465.
K. Robbie, et al.; Fabrication of Thin Films With Highly Porous Microstructures; J. Vac. Sci. Technol. A 13(3), May/Jun. 1995; pp. 1032-1035.
K. Robbie, et al.; First Thin Film Realization of a Helicoidal Bianisotropic Medium; J. Vac. Sci. Technol. A 13(6), Nov/Dec. 1995; pp. 2991-2993.
Wang, et al.; Layer uniformity of glancing angle deposition; Vaccum; vol. 78, Issue 1, Apr. 4, 2005, pp. 107-111.

(Continued)

*Primary Examiner*—H. (Holly) T Le
(74) *Attorney, Agent, or Firm*—Thomas, Kayden, Horstemeyer & Risley LLP

(57) ABSTRACT

Substrates having nanostructures disposed thereon and methods of forming nanostructures on the substrates are disclosed. In particular, embodiments of the present invention provide for structures having a substrate having a non-planar surface. In an embodiment, a portion of the non-planar surface has at least one layer of nanostructures disposed thereon.

20 Claims, 13 Drawing Sheets

OTHER PUBLICATIONS

Schubert, et al.; Nanostructure fabrication by glancing angle ion beam assisted deposition of silicon; Applied Physics A: Materials Science & Processing; vol. 81, No. 3 / Aug. 2005.

Brett, et al.; Glancing Angle Deposition, An Overview of Thin Films and GLAD; http://www.ece.ualberta.ca/~glad/glad.html; 2006.

Gish, et al.; Evaluation of silver nanostructures fabricated using glancing angle deposition as localized surface plasmon resonance biosensors; Nanotech 2007 Conference Program Abstract.

Katherine a. Willets and -Richard P. Van Duyne; Localized Surface Plasmon Resonance Spectroscopy and Sensing; Annual Review of Physical Chemistry; vol. 58: 267-297 (vol. publication date May 2007); First published online as a Review in Advance on Oct. 26, 2006.

ARS Project: 408043—Annual Reports for 2004-2007; USDA Agricultural Research Service.

Big Discovery Symposium 2006; UC Santa Barbara; Epigenetic Enzymes and Therapies; slide show.

Kathy Kincade; Raman Spectroscopy: SERS and Silver Nanorods Quickly Reveal Viral Structures; Laser Focus World; Jan. 1, 2007.

Kathy Kincade; Optoelectronic Applications: Nanophotonics—An "Old" Technique Finds New Life in the Nano World; Laser Focus World; Oct. 1, 2006.

Kawai, et al.; Raman Spectroscopic Probes Withstand Hostile Environments; Laser Focus World; Jun. 1, 2005.

Amri, et al.; Adenine and RNA in Mineral Samples. Surface-Enhanced Raman Spectroscopy (SERS) for Picomole Detections; Spectrochimica Acta Part A 59 (2003) pp. 2645-2654.

Stuart, et al.; In Vivo Glucose Measurement by Surface-Enhanced Raman Spectroscopy; Anal. Chem. 2006, 78, pp. 7211-7215.

Faulds, et al.; DNA Detection by Surface Enhanced Resonance Raman Scattering (SERRS); The Royal Society of Chemistry 2005; Analyst, 2005, 130, pp. 1125-1131.

Bell, et al.; Surface-Enhanced Raman Spectroscopy (SERS) for Sub-Micromolar Detection of DNA/RNA Mononucleotides; J. Am. Chem. Soc. 2006, 128, pp. 15580-15581.

Yun Wei Charles Cao, et al.; Nanoparticles with Raman Spectroscopic Fingerprints for DNA and RNA Detection; Science, 297; 2002; pp. 1536-1540.

Gish, et al.; Evaluation of Silver nanostructures Fabricated Using Glancing Angle Deposition as Localized Surface Plasmon Resonance Biosensors; The Nanotechnology Conference and Trade Show; Boston, Jun. 1-5, 2008; abstract.

Wang, et al.; Layer Uniformity of Glancing Angle Deposition; Vacuum; 78; 2005; pp. 107-111.

Schubert; Nanostructure Fabrication by Blancing Angle Ion Beam Assisted Deposition of Silicon; Appl. Physc. A81, 481-486 (2005).

Willets, et al.; Localized Surface Plasmon Resonance Spectroscopy and Sensing; Annu. Rev. Phys. Chem 2007; 52; 267-297.

Prokes, et al.; Enhanced Plasmon Coupling in Crossed Dielectric/Metal Nanowire Composite Geometries and Applications to Surface-Enhanced Raman Spectroscopy; Appl. Physc. Lett; 90; 2007; 3 pages.

D. Keith Roper; Determining Surface Plasmon Resonance Response Factors for Deposition onto Three-Dimensional Surfaces; Chemical Engineering Science; 62; 2007; pp. 1988-1996.

Takemoto, et al.; A Surface Plasmon Resonance Assay for the Binding of Influenza Virus Hemagglutinin to Its Sialic Acid Receptor; Virology; 217; 452-458 (1996) Article No. 0139.

Hardy, et al.; Valency of Antibody Binding to Enveloped Virus Particles as Determined by Surface Plasmon Resonance; Journal of Virology; Jan. 2003; p. 1649-1652; vol. 77, No. 2.

Publication US2004/0224321; Published Nov. Nov. 11, 2004; Nicolau, et al.; Micro/Nano-Structures Fabricated by Laser Ablation for Micro-Array Applications.

A Graded Improvement; Science, vol. 319; Feb. 29, 2008, p. 1163.

Kim; et al.; Light-Extraction Enhancement of GaInN Light-Emitting Diodes by Graded-Refractive-Index Indium Tin Oxide Anti-Reflection Contact; Adv. Mater. 2008, 20, pp. 801-804.

Robbie, et al.; Sculptured Thin Films and Glancing Angle Deposition: Growth Mechanics and Applications; J. Va. Sci. Technol. A 15(3), May/Jun. 1997; pp. 1460-1465.

Robbie, et al.; Fabrication of Thin Films With Highly Porous Microstructures; J. Va. Sci. Technol. A 13(3), May/Jun. 1995; pp. 1032-1035.

Robbie, et al.; First Thin Film Realization of a Helicoidal Bianisotropic Medium; J. Vac. Sc. Technol. A 13(6), Nov./Dec. 1995; pp. 2991-2993.

Vaeth, et al.; Transition Metals for Selective Chemical Vapor Deposition of Parylene-Based Polymers; Apr. 18, 2000; Chem. Mater, 2000, 12, pp. 1305-1313.

Vaeth, et al.; Use of Microcontact Printing for Generating Selectively Grown Films of Poly (p-phenylen vinylene) and Parylenes Prepared by Chemical Vapor Deposition; Sep. 22, 2000; Langmuir 2000, 16, pp. 8495-8500.

Pursel, et al.; Growth of Sculptured Polymer Submicronwire Assembles by Vapor Deposition; 2005; Polymer 46 (2005) pp. 95544-9548.

Hu, et al.; Fabrication, Characterization, and Application in SERS of Self-Assembled Polyelectrolyte-Gold Nanorod Multilayered Films; Sep. 22, 2005; J. Phys. Chem. B 2005, 109, pp. 19385-19389.

Guo, et al.; Bifunctional Au @pt Hybrid Nanorods; 2007; Journal of Colloid and Interface Science, 315 (2007) pp. 363-368.

Suzuki, et al.; Au Nanorod Arrays Tailored for Surface-Enhanced Raman Spectroscopy; 2007; Analytical Sciences; Jul. 2007, vol. 23; pp. 829-833.

Suzuki, et al.; In-Line Aligned and Bottom-Up Ag Nanorods for Surface-Enhanced Raman Spectroscopy; 2006; Applied Physics Letters; 88, 2003121 (2006); 3 pages.

Tiwari, et al.; Non-Resonance SERS Effects of Silver Colloids with Different Shapes; 2007; Chemical Physics Letters, 446 (2007) pp. 77-82.

Chu, et al.; A High Sensitive Fiber SERS Probe Based on Silver Nanorod Arrays; Optics Express; vol. 15, No. 19; Sep. 17, 2007; pp. 12230-12239.

Chu, et al.; Silver Nanorod Arrays as a Surface-Enhanced Raman Scattering Substrate for Foodborne Pathogenic Bacteria Detection; 2008; Applied Spectroscopy, vol. 62, No. 8, 2008; pp. 922-931.

Yao, et al.; Cobalt and Nickel Nanorod Array Electrodes as New SERS Active Substrates; 2007; 2 pages.

Yang, et al.; Aligned Silver nanorod Arrays for Surface-Enhanced Rman Scattering; 2006; on-line at www.iop.org/EJ/abstract/0957-4484/17/10/038.

Zhao, et al.; Aligned Copper nanorod Arrays for Surface-enhanced Raman Scattering; 2007; online at http://ieeexplore.ieee.org/Xplore/dfdeny.jsp?url=/ie15/4295685/429.

Huang, et al.; Single-Domain Antibody-Conjugated nanoaggregate-Embedded Beads for Targeted Detection of Pathogenic Bacteria; Chem. Eur. J. 2009, 00, 0-0; pp. 1-6.

* cited by examiner

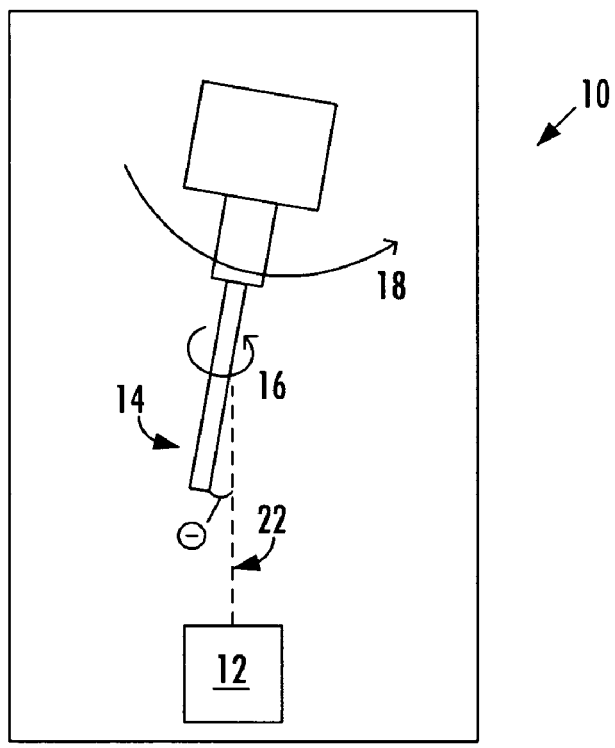
FIG. 1
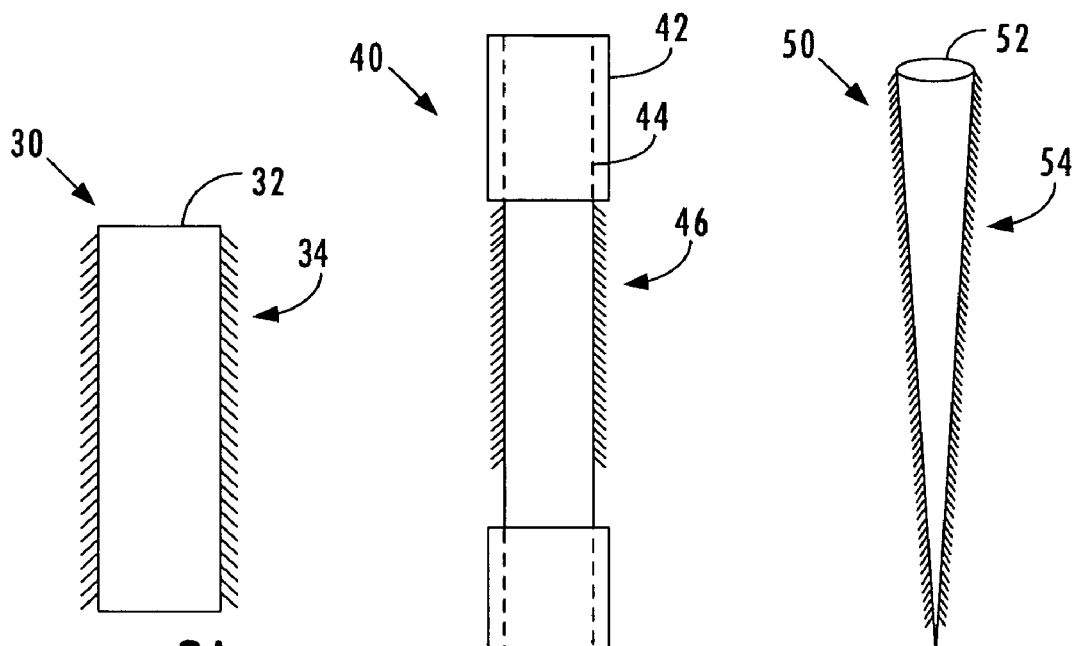
FIG. 2A
FIG. 2B
FIG. 2C

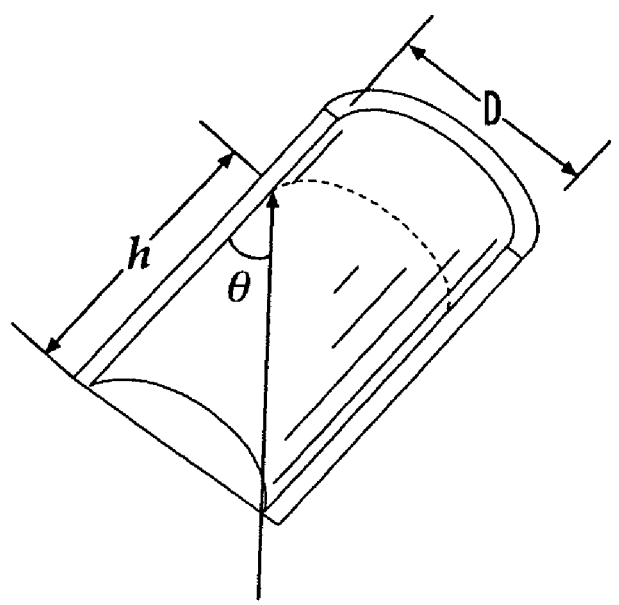
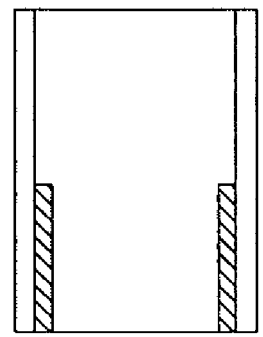
FIG. 13A  FIG. 13B
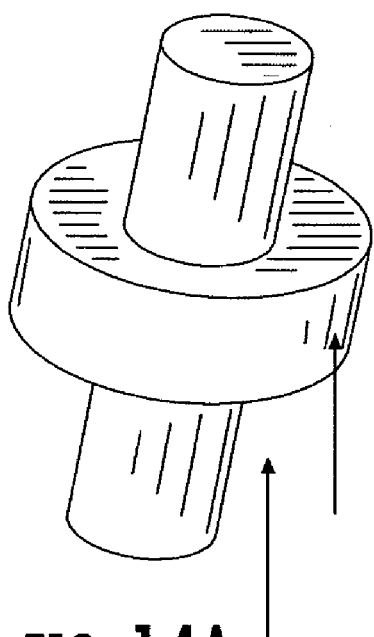
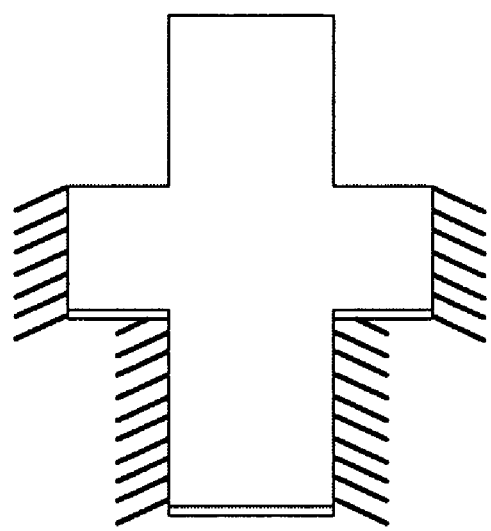
FIG. 14A  FIG. 14B

STRUCTURES HAVING ALIGNED NANORODS AND METHODS OF MAKING

CROSS-REFERENCE TO RELATED APPLICATION

This application claims priority to co-pending U.S. provisional application entitled, "DIRECT DEPOSITION OF ALIGNED NANOROD ARRAY ONTO CYLINDRICAL OBJECTS," having Ser. No. 60/620,810, filed Oct. 21, 2004, which is entirely incorporated herein by reference.

STATEMENT REGARDING FEDERALLY SPONSORED RESEARCH OR DEVELOPMENT

This invention was made with government support under Grant Award No.: ECS0304340 awarded by the National Science Foundation. The government has certain rights in the invention.

TECHNICAL FIELD

The present disclosure is generally related to nanostructures and, more particularly, embodiments of the present disclosure are related to structures having nanostructures formed thereon.

BACKGROUND

Nanostructures have been incorporated into many kinds of sensors to obtain high sensitivity and specificity. For example, in surface enhanced Raman spectroscopy (SERS) based sensors, using colloidal silver nano-particles, researchers were able to detect single dye molecules with an enhancement factor on the order of $10^{14}$-$10^{15}$; in surface plasmon resonance (SPR) based sensors, silver or gold nano-particle films have been used to dynamically tune the resonance wavelength. Also, using fiber optics in SERS or SPR, one can miniaturize the device while maintaining the sensitivity. So far, there are several limited methods for preparing nanostructures on fiber optical probes suitable for SERS and SPR based sensors, for example, sputtering or e-beam evaporating metal thin films onto optical fiber tips, or dipping functionalized optical fibers into colloidal solutions. Nanostructures prepared by the dipping method are random, and the reproducibility is poor. It is also important that the fabrication technique is compatible with current microfabrication processes.

SUMMARY

Substrates having a non-planar surface and nanostructures disposed on the non-planar surface, and methods of making the substrates, are disclosed. A representative embodiment of a structure, among others, includes a substrate having a non-planar surface. A portion of the non-planar surface has at least one layer of nanostructures disposed thereon. The substrate is a symmetrical structure having one center axis of rotation. The nanostructures have a length of about 10 nanometers (mn) to 5000 nm.

A representative embodiment of a method a forming nanostructures, among others, includes rotating a substrate having a non-planar surface at an angle $\theta$, where $\theta$ is the angle defined by a vapor arrival line and a center axis of rotation of the substrate, and where the substrate is a symmetrical structure having one center axis of rotation. The non-planar substrate is rotated, at angle $\theta$, about its center axis of rotation, exposing the non-planar substrate to a vapor flux of a first type of material as the substrate rotates, wherein the exposure is at a temperature of less than a melting point of the material, and thereby forming nanostructures on the substrate.

A representative embodiment of a method of forming nanostructures, among others, includes rotating a conical substrate at an angle $\theta$−$\alpha$, where $\theta$ is the angle defined by a vapor arrival line and a substrate normal and $\alpha$ is the semi-vertical angle of the conical substrate, wherein the conical substrate is a symmetrical structure having one center axis of rotation. The conical substrate is thus rotated about its center axis of rotation, exposing the substrate to a vapor flux of a first material as the substrate rotates, wherein the exposure is at a temperature of less than a melting point of the material, and thereby forming nanostructures on the substrate.

BRIEF DESCRIPTION OF THE DRAWINGS

Many aspects of this disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 1 illustrates an embodiment of a modified oblique angle deposition (OAD) system.

FIGS. 2A through 2G illustrate various shapes of substrates having nanostructures deposited on the surface or portions of the surface of the substrate.

FIG. 7(c) shows a sketch of nanorods formed on the surface.

FIG. 13 illustrates coated aligned nanorods on the inner surface of a tube: (*a*) the tube and the deposition configuration; and (*b*) the illustration of the coating results.

FIG. 14 illustrates coated aligned nanorods on irregular shaped cylinder: (*a*) the irregular shaped cylinder and the deposition configuration; and (*b*) the illustration of the coating results.

DETAILED DESCRIPTION

Figure 2D:
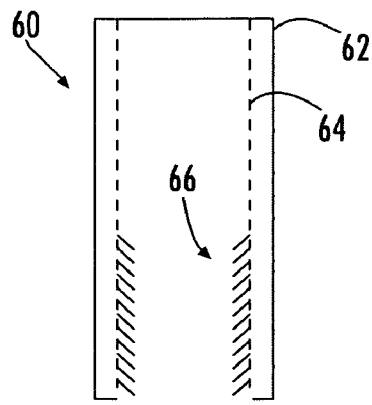

Before the embodiments of the present disclosure are described in detail, it is to be understood that unless otherwise indicated the present disclosure is not limited to particular materials, reagents, reaction materials, manufacturing processes, or the like, as such may vary. It is also to be understood that the terminology used herein is for purposes of describing particular embodiments only, and is not intended to be limiting. It is also possible in the present disclosure that steps may be executed in different sequence where this is logically possible.

It must be noted that, as used in the specification and the appended claims, the singular forms "a," "an" and "the" include plural referents unless the context clearly dictates otherwise.

Discussion

Substrates having nanostructures disposed thereon and methods of forming a layer of nanostructures on the substrates are disclosed. The substrates are symmetrical and have non-planar surfaces. In addition, the substrates have one center axis of rotation. The nanostructures (e.g., nanorods) can be formed on the entire surface of the nanostructure or select portions of the surface. In particular, the nanostructures form a uniform array of nanostructures on the non-planar surface.

The nanostructures can be formed using a modified oblique angle deposition (OAD) technique/system. For example, the OAD system can include a two-axis substrate motion system in a physical vapor deposition (PVD) device (e.g., thermal evaporation, e-beam evaporation, sputtering growth, pulsed laser deposition, and the like) that operates at temperatures lower than the melting point of the material used to form the nanostructures. In an embodiment, the substrate motion system provides two rotation movements: one is the polar rotation, which changes angle between the substrate surface normal and the vapor source direction, and one is the azimuthal rotation, where the sample rotates about its center axis of rotation (e.g., normal principle axis).

At least one advantage of using the OAD system is that the nanostructures (e.g., nanorods) can be formed at temperatures compatible with substrates such as, but not limited to, optical fibers, waveguides, and the like. This is in contrast to other techniques that operate under conditions (e.g., high temperatures) that are not compatible with many substrates of interest. Another advantage of using the OAD system is that catalysts are not needed to form the nanostructures, in contrast to currently used technologies. Since a vacuum system is used, the purity of the nanorods is very high, and the vacuum system is compatible with conventional microfabrication processes.

The substrates can be used as optical sensors (e.g., infrared (IR) sensors, fluorescence sensors, surface enhanced Raman spectroscopy sensors (SERS), optical absorption based sensors, surface enhanced infrared spectroscopy based sensors, and the like). In addition, the substrates can be used to detect chemical and/or biological compounds and/or pathogens. For example, the substrates can be used to detect chemical and/or biological warfare agents.

The layer of nanostructures can act as a coating layer such as, but not limited to, optical coatings (e.g., anti-reflection, optical filter, and the like), anti-contamination coatings, hydrophobic coatings (e.g., super hydrophobic coatings), hydrophilic coatings, porous layer coatings, microfluidic layers, thermal barriers, catalyst coatings, and the like.

FIG. 1 illustrates an embodiment of an OAD system 10. The OAD system 10 includes, but is not limited to, an evaporation source 12, a substrate 14, and a substrate manipulation mechanism (e.g., one or more motors) to move (e.g., rotate) the substrate relative to the evaporation source 12. A motor (not shown) of the OAD system 10 can move the substrate in an azimuthal rotation 16, where the sample rotates about its center axis of rotation (normal principle axis). Another motor (not shown) of the OAD system 10 can move the substrate in a polar rotation 18, which changes the angle (θ) between the substrate rotating axis (e.g., center axis of rotation) and the vapor source direction (e.g., vapor arrival line 22). The OAD system 10 can also include appropriate vacuum pumps and electronic control equipment as are known in the art. Additional details regarding the OAD system 10 are described in Example 1.

Embodiments of the OAD system 10 can include a physical vapor deposition (PVD) device, such as thermal evaporation, e-beam evaporation, molecular beam epitaxy (MBE), sputtering growth, pulsed laser deposition, combinations thereof, and the like. In this embodiment, the PVD is a thermal evaporation source 12, where a material can be heated to an appropriate temperature to evaporate the material. The heating temperature depends, at least in part, on the material, the substrate 14, and other conditions in the OAD system 10. Typically, the temperature is less than the melting point (e.g., less than one-third of the melting point) of the material being evaporated. Additional details regarding one embodiment are described in Example 1.

The OAD system 10 can operate at a substrate temperature less than the melting point of the material being evaporated. In particular, the substrate of OAD system 10 can operate at or near room temperature, be cooled to liquid nitrogen temperature, or be heated to a temperature of about ⅓ of the melting temperature of the material being evaporated. Thus, substrates having a relatively low melting point (e.g., plastics such as those used in fiber optics) can be used, unlike other high temperature techniques. The OAD system 10 can operate at a pressure where the mean free path of the gas in the chamber during deposition is comparable or larger than the source-substrate distance.

The substrate 14 can be mounted or otherwise attached to an arm or other component in communication with the motors that move the substrate. In an embodiment, to deposit nanostructures (e.g., nanorods) onto the substrate 14, the substrate 14 is slightly rotated polarly in order to make an angle θ less than about 15° (e.g., θ less than about 12°, θ less than about 10°, θ less than about 8°, and θ less than about 5°; and where θ is from about 0 to 15°, about 0 to 12°, about 0 to 10°, about 0 to 8°, and about 0 to 5°), with respect to the incoming vapor direction. Then, the source material is evaporated at a constant rate (e.g., the rate is about 0.1 nm/sec to 0.3 nm/sec, about 0.1 nm/sec to 0.6 nm/sec, about 0.1 nm/sec to 1 nm/sec, about 0.1 nm/sec to 1.5 nm/sec, and about 0.1 nm/sec to 2 nm/sec), or substantially constant rate, in the evaporation source 12, while the substrate 14 is rotated with a constant speed azimuthally (e.g., the speed is about 0.01 rev/sec to 0.05 rev/sec, about 0.01 rev/sec to 0.1 rev/sec, about 0.01 rev/sec to 0.2 rev/sec, and about 0.01 rev/sec to 0.4 rev/sec). The nanostructures of the evaporated material are thereby deposited (e.g., uniformly deposited) onto the sidewall (e.g., the inner and/or outer sidewall or selected portions thereof) of the substrate. The temperature, the pressure, the deposition rate, the angle of vapor incidence, the evaporating material, and the speed of the azimuthally rotation can be adjusted to control the properties of the nanostructures (e.g., the length, diameter, density, composition, and the like). Additional details regarding the process are described in Example 1.

The materials used to make the nanostructures can include materials such as, but not limited to, a metal, a metal oxide, a metal nitride, a metal oxynitride, a doped material, a polymer, a multicomponent compound, a compound (e.g., a compound or precursor compound (organic or inorganic compound) including a metal, a metal oxide, a metal nitride, a metal oxynitride, a doped material), and combinations thereof. The metals can include, but are not limited to, silver, nickel, aluminum, silicon, gold, platinum, palladium, titanium, copper, cobalt, zinc, oxides of each, nitrides of each, oxynitrides of each, and combinations thereof. In particular, the materials can include the following: silver, nickel, silicon, and titanium oxide. The composition of the nanostructures is the same as that of the materials described herein or a combination of the materials described herein, or alternative layers of each.

The nanostructures can include, but are not limited to, nanorods, nanowires, and uniform arrays of each. The array of nanostructures can be defined as having a distance of about 10 to 30 nm, about 10 to 60 nm, about 10 to 100 nm, about 10 to 150 nm, and about 10 to 200 nm, between each of the nanostructures. Alternatively, the array of nanostructure can be defined as having an average density of about 11 to 2500/μm².

Figure 2E:
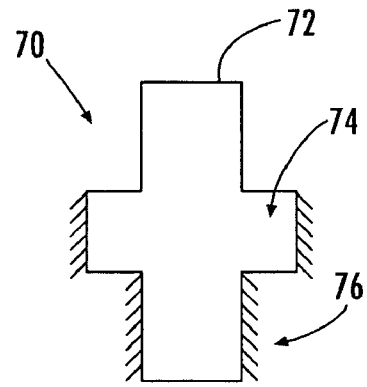
Figure 2F:
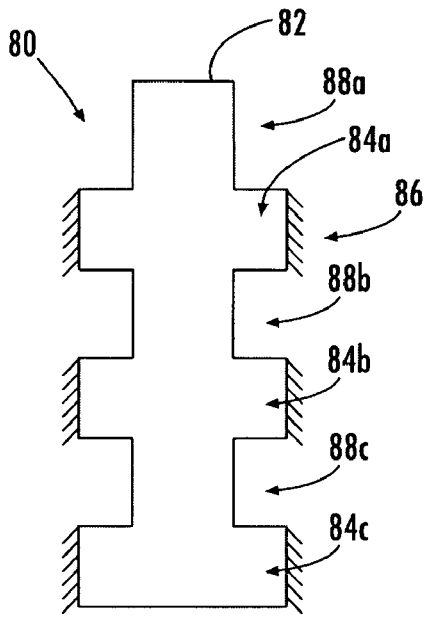
Figure 2G:
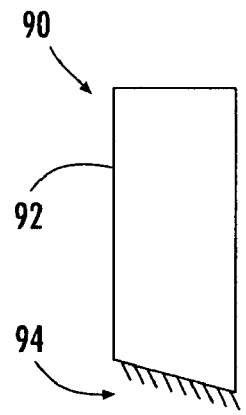
Figure 2H:
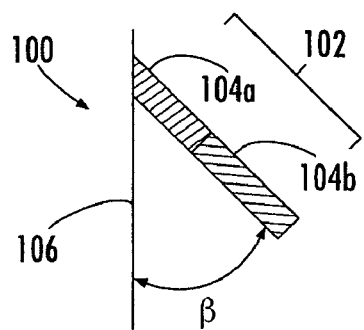
FIGS. 2H through 2S illustrate nanostructures fabricated with multiple layers, configurations, and materials.
Figure 2I:
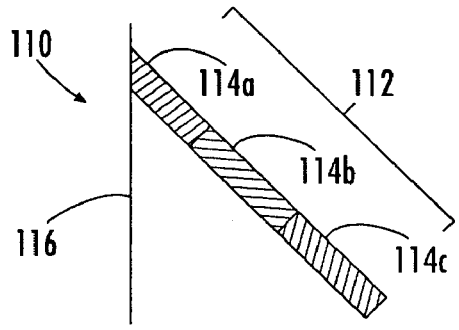

The length is the largest dimension of the nanostructure and is the dimension extending from the substrate (FIGS. 2H and 2I). The nanostructure can have a length of about 10 nm to 5000 nm, about 10 nm to 4000 nm, about 10 nm to 3000 nm, about 10 nm to 2000 nm, about 10 nm to 1000 nm, about 10 nm to 500 nm, about 10 nm to 250 nm, about 10 nm to 100 nm, and about 10 nm to 50 nm. The length depends, at least in part, upon the deposition time, deposition rate, and the total amount of evaporating materials. The diameter is the dimension perpendicular to the length. The diameter of the nanostructure is about 10 to 30 nm, about 10 to 60 nm, about 10 to 100 nm, about 10 to 150 nm. One or more of the dimensions of the nanostructure could be controlled by the deposition conditions and the materials.

In an embodiment, the nanostructure is a nanorod. In particular, the nanorod is formed in a uniform array on the substrate. The nanorod can have the dimensions and characteristics as described above. In particular, the nanorods (e.g., silver, nickel, silicon, and titanium oxide) are disposed on an optical fiber, or other cylindrically symmetric substrates.

As mentioned above, the substrates are symmetrical about one center axis of rotation and have a non-planar surface. The non-planar surface can be an inside surface and/or an outside surface of the substrate (64 and 62 respectively of FIG. 2D). The non-planar surface can include, but is not limited to, a cylindrical surface (FIG. 2A), a tapered surface, a conical surface (FIG. 2C), a tapered cylindrical surface, a cylindrical ringed substrate, and the like. The cylindrical ringed substrate has a cylindrical surface base and at least one symmetrical cylindrical ring extending from the central axis of rotation of the substrate (FIGS. 2E and 2F). The length of the substrate can be from about 1 to 75 mm. The diameter of the substrate can be about 1 μm to 1 mm.

Exemplary substrates include, but are not limited to, optical fibers, waveguides, glass tubes, capillary tubes, metallic rods/tubes, and the like. In an embodiment, the optical fiber can be stripped of the outer covering to reveal the fiber, or, alternatively, only portions of the optical fiber are exposed through "window" (openings) through the cladding. In another embodiment, the end of an optical fiber can be thermally pulled into a taped end with different taping angles. Additional details regarding forming nanostructures on optical fibers are discussed in more detail in Example 1.

FIGS. 2A through 2G illustrate various shapes of substrates having nanostructures disposed on the surface or portions of the surface of the substrate. FIG. 2A illustrates a substrate 30 having a cylindrical surface 32. The substrate 32 has a layer of nanostructures 34 disposed thereon.

FIG. 2B illustrates a substrate 40 (e.g., an optical fiber) having an outer coating 42 and a cylindrical surface 44. A portion of the cylindrical surface 44 is exposed by removing a portion of the outer coating 42. A layer of nanostructures 46 is disposed on the exposed portion of the cylindrical surface 44.

FIG. 2C illustrates a substrate 50 having a conical surface 52. A layer of nanostructures 54 is disposed on the conical surface 52. In this embodiment, the conical surface 52 tapers to a point, but in other embodiments, the taper may not end in a point.

FIG. 2D illustrates a substrate 60 having an outside cylindrical surface 82. In addition, the substrate 60 has a hollow tip exposing the inside cylindrical surface 64 of the substrate 60. A layer of nanostructures 66 is disposed on the inside cylindrical surface 64 of the substrate 60. In another embodiment, the layer of nanostructures can also be formed on the outside cylindrical surface 82.

FIG. 2E illustrates a substrate 70, a cylindrical ringed substrate, having a cylindrical surface 72. In contrast to the cylindrical surface 32 of FIG. 2A, the cylindrical surface 72 has a cylindrical ring 74 as part of the cylindrical surface 72. A layer of nanostructures 76 is formed on the cylindrical surface 72.

FIG. 2F illustrates a substrate 80, a cylindrical ringed substrate, having a cylindrical surface 82. In this embodiment, the cylindrical surface 82 has three cylindrical rings 84a, 84b, and 84c as part of the cylindrical surface 82. A layer of nanostructures 86 is formed on the outer portion of the cylindrical rings 84a, 84b, and 84c. The cylindrical rings 84a, 84b, and 84c can act to block formation of nanostructures on portions 88a, 88b, and 88c of the shadowed cylindrical surface 82. The portion shadowed depends, at least in part, upon the dimension of the cylindrical rings 84a, 84b, and 84c and the angle of deposition, θ. Thus, cylindrical rings can be used to design where nanostructures are formed on the surface of the substrate. In another embodiment, two or more rings can be used to design the particular structure of interest.

FIG. 2G illustrates a substrate 90 having a cylindrical surface 92. A layer of nanostructures 94 is formed on the tip of the cylindrical surface 92. The angle of the ending surface with respect to the axis of the cylinder can be adjusted from about 2° to 90°, according to different polishing conditions. In another embodiment, a layer of nanostructures can be formed on other portions of the cylindrical surface as well.

It should be noted that the nanostructure could have multiple layers of different materials or alternating materials. FIGS. 2H and 2I illustrate nanostructures (e.g., nanorods) fabricated from two and three materials, respectively. In particular, FIG. 2H illustrates a nanostructure 102 disposed on a substrate 100 having a cylindrical surface 106. The nanostructure 102 includes two layers of different materials 104a and 104b. The materials can be any combination of the materials described herein. The dimensions of the nanostructure 102 can include those described herein. In another embodiment, additional layers of materials can be formed on the nanostructure 102. For example, a repeating pattern of layers 104a and 104b can be created. Additional details are discussed in Example 1.

FIG. 2H also shows the angle, β, formed between the nanostructure 102 and the substrate 106. The angle can be about 40° to 50°, about 30° to 60°, and about 30° to 70°. The conditions and the materials used to prepare the nanostructure 102 can be used to select the angle.

FIG. 2I illustrates a nanostructure 112 disposed on a substrate 110 having a cylindrical surface 116. The nanostructure 112 includes three layers of different materials 114a, 114b, and 114c. The materials can be any combination of the materials described herein. The dimensions of the nanostructure 112 can include those described herein. In another embodiment, additional layers of materials can be formed on the nanostructure 112.

Figure 2J:
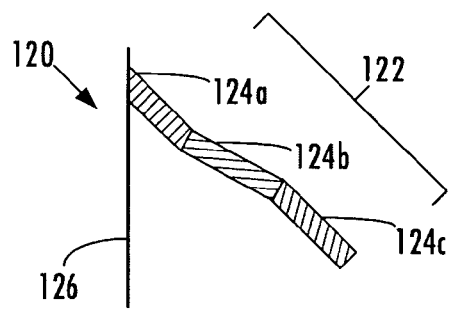

FIG. 2J illustrates a nanostructure 122 disposed on a substrate 120 having a cylindrical surface 126. The nanostructure 122 includes three layers of the same material 124a, 124b, and 124c, in a zig-zag pattern. The dimensions of the nanostructure 122 can include those described herein. The zig-zag nanostructure can be created by changing the incident angle periodically from $\theta_1$ and $\theta_2$.

Figure 2K:
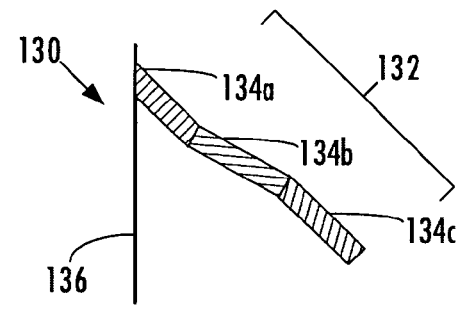

FIG. 2K illustrates a nanostructure 132 disposed on a substrate 130 having a cylindrical surface 136. The nanostructure 132 includes two materials in alternating layers, where layer 134a and 134c are the same material, and layer 134b is a different material. The materials can be any combination of the materials described herein. The three layers, 134a, 134b, and 134c, are in a zig-zag pattern. The dimensions of the nanostructure 132 can include those described herein. The zig-zag nanostructure can be created by changing the incident angle periodically from $\theta_1$ and $\theta_2$, simultaneously changing the evaporating materials.

Figure 2L:
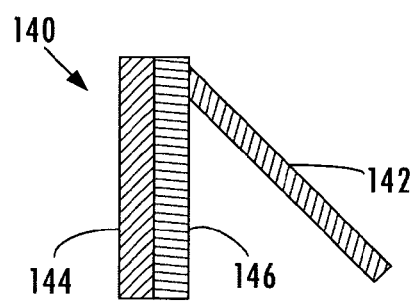

FIG. 2L illustrates a nanostructure 142 disposed on a layer 146 disposed on a substrate 140 having a cylindrical surface 144. The layer 146 can be made of a material, such as, but not limited to, a metal, a metal oxide, a metal nitride, a metal oxynitride, a doped material, a polymer, a multicomponent compound, and combinations thereof. The layer 146 can have a thickness of about 10 to 50 nm, about 10 to 100 nm, about 10 to 200 nm, about 10 to 500 nm, about 10 to 800 nm, about 10 to 1000 nm, and about 10 to 2000 nm. The dimensions of the nanostructure 142 can include those described herein. The layer 146 can be made by changing the incident angle θ first to 90 degrees, depositing a uniform layer of thin film by continuous azimuthal rotation, and then tilting to a smaller angle to deposit nanostructure 142 on top of the film.

Figure 2M:
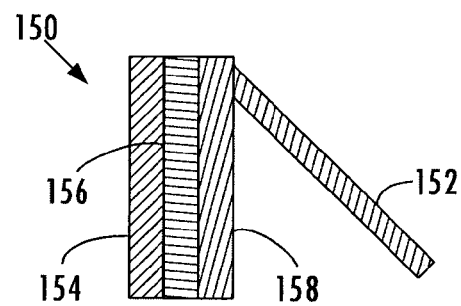

FIG. 2M illustrates a nanostructure 152 disposed on a second layer 158 disposed on a first layer 156 that is disposed on a substrate 150 having a cylindrical surface 154. The first and second layers 156 and 158 can each be made of a material, such as, but not limited to, a metal, a metal oxide, a metal nitride, a metal oxynitride, a doped material, a polymer, a multicomponent compound, and combinations thereof. The first and second layers 156 and 158 can each have a thickness of about 10 to 50 nm, about 10 to 100 nm, about 10 to 200 nm, about 10 to 500 nm, about 10 to 800 nm, about 10 to 1000 nm, and about 10 to 2000 nm. The dimensions of the nanostructure 152 can include those described herein. The first and second layers 156 and 158 can be made by changing the incident angle θ first to 90 degree, depositing a uniform first layer 156 by continuous azimuthal rotation, and subsequently depositing a uniform second layer 158 by continuous azimuthal rotation. Then, θ is changed to a smaller angle to deposit nanostructure 152 on top of the second layer 158.

Figure 2N:
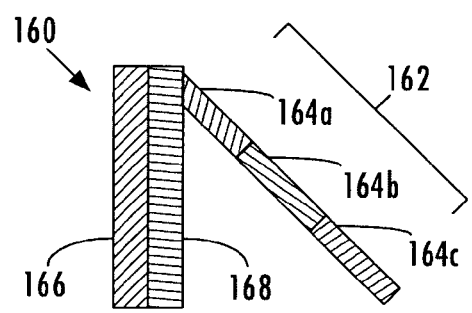

FIG. 2N illustrates a nanostructure 162 disposed on a layer 168 disposed on a substrate 160 having a cylindrical surface 166. The layer 168 can be made of a material, such as, but not limited to, a metal, a metal oxide, a metal nitride, a metal oxynitride, a doped material, a polymer, a multicomponent compound, and combinations thereof. The layer 168 can have a thickness of about 10 to 50 nm, about 10 to 100 nm, about 10 to 200 nm, about 10 to 500 nm, about 10 to 800 nm, about 10 to 1000 nm, and about 10 to 2000 nm. The nanostructure 162 includes two materials in alternating layers, where layer 164a and 164c are the same material, and layer 164b is a different material. The materials can be any combination of the materials described herein. The dimensions of the nanostructure 162 can include those described herein. The layer 166 can be made by changing the incident angle θ first to 90 degrees, depositing a uniform layer of thin film by continuous azimuthal rotation, and then tilting to a smaller angle to deposit nanostructure 162 on top of the film.

Figure 2O:
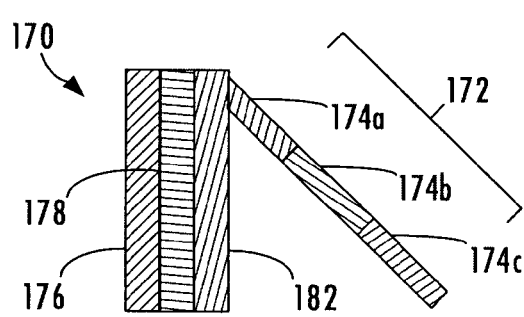

FIG. 2O illustrates a nanostructure 172 disposed on a second layer 182 disposed on a first layer 178 that is disposed on a substrate 170 having a cylindrical surface 176. The first and second layers 178 and 182 can each be made of a material, such as, but not limited to, a metal, a metal oxide, a metal nitride, a metal oxynitride, a doped material, a polymer, a multicomponent compound, and combinations thereof. The first and second layers 178 and 182 can each have a thickness of about 10 to 50 nm, about 10 to 100 nm, about 10 to 200 nm, about 10 to 500 nm, about 10 to 800 nm, about 10 to 1000 nm, and about 10 to 2000 nm. The nanostructure 172 includes two materials in alternating layers, where layer 174a and 174c are the same material, and layer 174b is a different material. The materials can be any combination of the materials described herein. The dimensions of the nanostructure 172 can include those described herein. The first and second layers 178 and 182 can be made by changing the incident angle θ first to 90 degrees, depositing a uniform first layer 178 by continuous azimuthal rotation, and subsequently depositing a uniform second layer 182 by continuous azimuthal rotation. Then, θ is changed to a smaller angle to deposit nanostructure 172 on top of the second layer 182.

Figure 2P:
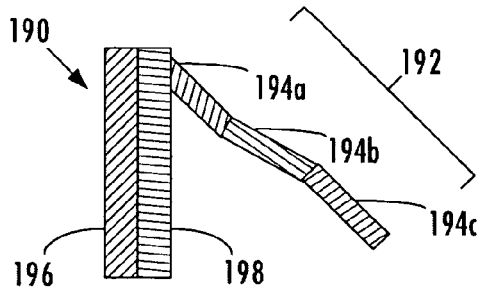

FIG. 2P illustrates a nanostructure 192 disposed on a layer 198 disposed on a substrate 190 having a cylindrical surface 196. The layer 198 can be made of a material, such as, but not limited to, a metal, a metal oxide, a metal nitride, a metal oxynitride, a doped material, a polymer, a multicomponent compound, and combinations thereof. The layer 198 can have a thickness of about 10 to 50 nm, about 10 to 100 nm, about 10 to 200 nm, about 10 to 500 nm, about 10 to 800 nm, about 10 to 1000 nm, and about 10 to 2000 nm. The nanostructure 192 includes three layers 194a, 194b, and 194c of the same material. The three layers 194a, 194b, and 194c, are in a zig-zag pattern. The materials can be any combination of the materials described herein. The dimensions of the nanostructure 192 can include those described herein. The layer 196 can be made by changing the incident angle θ first to 90 degrees, then depositing a uniform layer of thin film by continuous azimuthal rotation. The zig-zag nanostructure can be created by changing the incident angle periodically from $\theta_1$ and $\theta_2$.

Figure 2Q:
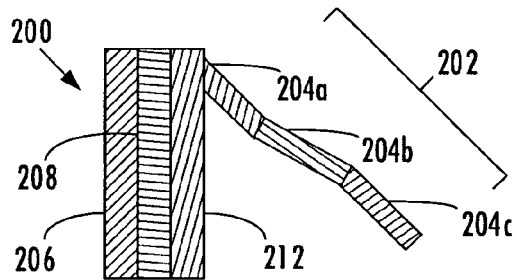

FIG. 2Q illustrates a nanostructure 202 disposed on a second layer 212 disposed on a first layer 208 that is disposed on a substrate 200 having a cylindrical surface 206. The first and second layers 208 and 212 can each be made of a material, such as, but not limited to, a metal, a metal oxide, a metal nitride, a metal oxynitride, a doped material, a polymer, a multicomponent compound, and combinations thereof. The first and second layers 208 and 212 can each have a thickness of about 10 to 50 nm, about 10 to 100 nm, about 10 to 200 nm, about 10 to 500 nm, about 10 to 800 nm, about 10 to 1000 nm, and about 10 to 2000 nm. The nanostructure 202 includes three layers 204a, 204b, and 204c of the same material. The three layers, 204a, 204b, and 204c, are in a zig-zag pattern. The materials can be any combination of the materials described herein. The dimensions of the nanostructure 202 can include those described herein. The first and second layers 208 and 212 can be made by changing the incident angle θ first to 90 degrees, depositing a uniform first layer 208 by continuous azimuthal rotation, and subsequently depositing a uniform second layer 212 by continuous azimuthal rotation. The zig-zag nanostructure can be created by changing the incident angle periodically from $\theta_1$ and $\theta_2$.

Figure 2R:
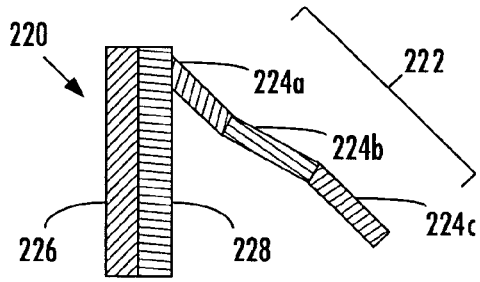

FIG. 2R illustrates a nanostructure 222 disposed on a layer 228 disposed on a substrate 220 having a cylindrical surface 226. The layer 228 can be made of a material, such as, but not limited to, a metal, a metal oxide, a metal nitride, a metal oxynitride, a doped material, a polymer, a multicomponent compound, and combinations thereof. The layer 228 can have a thickness of about 10 to 50 nm, about 10 to 100 nm, about 10 to 200 nm, about 10 to 500 nm, about 10 to 800 nm, about 10 to 1000 nm, and about 10 to 2000 nm. The nanostructure 222 includes two materials in alternating layers, where layer 224a and 224c are the same material, and layer 224b is a different material. The three layers, 224a, 224b, and 224c, are in a zig-zag pattern. The materials can be any combination of the materials described herein. The dimensions of the nanostructure 222 can include those described herein. The layer 226 can be made by changing the incident angle θ first to 90 degrees, then depositing a uniform layer of thin film by continuous azimuthal rotation. The zig-zag nanostructure can be created by changing the incident angle periodically from $\theta_1$ and $\theta_2$, and simultaneously changing the evaporating materials.

Figure 2S:
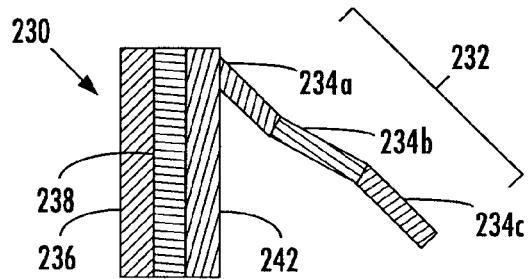

FIG. 2S illustrates a nanostructure 232 disposed on a second layer 242 disposed on a first layer 238 that is disposed on a substrate 230 having a cylindrical surface 236. The first and second layers 238 and 242 can each be made of a material, such as, but not limited to, a metal, a metal oxide, a metal nitride, a metal oxynitride, a doped material, a polymer, a multicomponent compound, and combinations thereof. The first and second layers 238 and 232 can each have a thickness of about 10 to 50 nm, about 10 to 100 nm, about 10 to 200 nm, about 10 to 500 nm, about 10 to 800 nm, about 10 to 1000 nm, and about 10 to 2000 nm. The nanostructure 232 includes two materials in alternating layers, where layer 234a and 234c are the same material, and layer 234b is a different material. The three layers, 234a, 234b, and 234c, are in a zig-zag pattern. The materials can be any combination of the materials described herein. The dimensions of the nanostructure 232 can include those described herein. The first and second layers 238 and 242 can be made by changing the incident angle θ first to 90 degrees, depositing a uniform first layer 238 by continuous azimuthal rotation, and subsequently depositing a uniform second layer 232 by continuous azimuthal rotation. The zig-zag nanostructure can be created by changing the incident angle periodically from $\theta_1$ and $\theta_2$, and simultaneously changing the evaporating materials Now having described the substrates having a non-planar surface in general, examples of possible embodiments of the substrate will be discussed. While embodiments of the substrates are described in connection with the example and the corresponding text and figures, there is no intent to limit embodiments of the substrates to these descriptions. On the contrary, the intent is to cover all alternatives, modifications, and equivalents included within the spirit and scope of embodiments of the present disclosure.

It should be emphasized that the above-described embodiments of the present disclosure are merely possible examples of implementations and are merely set forth for a clear understanding of the principles of the disclosure. Many variations and modifications may be made to the above-described embodiments. All such modifications and variations are intended to be included herein within the scope of this disclosure and protected by the following claims.

EXAMPLE 1

This Example describes fabricating aligned nanorods at room temperature using a modified oblique angle deposition (OAD) technique. Nanotubes, nanowires, and nanorods are well understood today and can be fabricated using many different techniques. Normally for OAD, the substrate is flat and the source materials are evaporated onto the substrate at an angle close to 90° with respect to the substrate surface normal. Because of the so-called shadowing effect, aligned nanorod or nanocolumn arrays will form on the substrate. The separation and height of the nanorods can be controlled by the incident angle and deposition time; thus, nanostructures with desired density and surface roughness can be achieved. However, this method has not been used for fabrication of nanorods on cylindrical objects.

Recently researchers fabricated carbon nanotubes (CNTs) perpendicular to contoured surfaces using the microwave plasma-enhanced chemical vapor deposition (MPECVD) method. It was also reported that a hydrothermal method for growing zinc oxide nanorods on flat and curved surfaces could be done by precoating the substrate with a thin aluminum film. Both the MPECVD and the hydrothermal synthesis required a catalytic coating layer and a high temperature chemical reaction (825° C. or wet environment). Moreover, they can only deposit one specific kind of nanostructure. This restricts their applications from fiber optical based sensors since most of the fibers cannot withstand high temperature, and may require different kinds of materials (for example, SERS and SPR require metallic nanostructures, while absorption or luminescence based sensors call for dielectrics).

In this Example, a conventional OAD was modified to directly deposit aligned nanorod arrays onto cylindrical objects, specifically onto uniformly cylindrical rods and tapered rods at room temperature. These structures, when aligned on a curved surface, can not only fix the drawbacks mentioned above, but also improve the sensitivity of the sensors due to the resulting large surface areas. Another advantage of this method is that it greatly simplifies the fabrication of nanostructure based fiber optic sensors and, therefore, improves their sensitivity and reproducibility.

Experiment Details

Figure 3A:
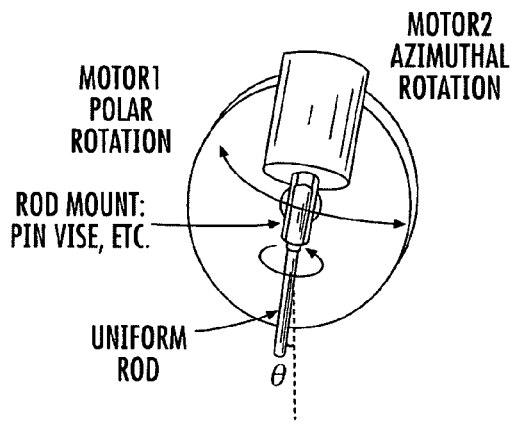
FIG. 3(a) illustrates an embodiment of a representative setup for nanorod deposition onto a cylindrical objects and (b) a sketch of the resulting nanorod/fiber structure.
Figure 3B:
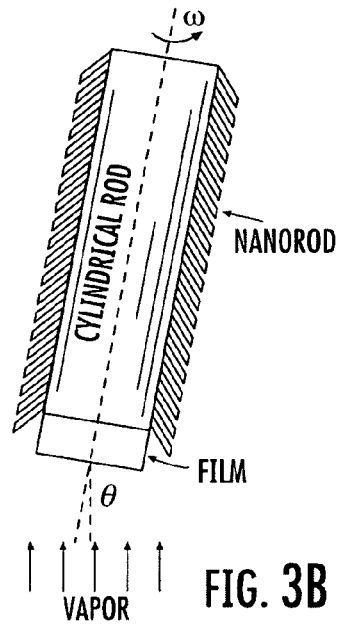

The experimental setup is shown in FIG. 3(a). Inside a physical vapor deposition (PVD) chamber, a cylindrical object such as optical fiber is installed coaxially onto a stepper motor (Motor2) through a pin vise. The object can be rotated in both polar (by Stepper Motor1) and azimuthal (by Stepper Motor2) directions, controlled by a computer. In order to deposit aligned nanorods onto the surface of a cylindrical object, the axis of the object is slightly rotated to a polar angle θ<10° by Motor1. Source material is evaporated onto the object at a constant rate. Therefore, during the deposition, the incoming vapors can be shadowed by nanostructures (including initial islands) on the surface, and the cylindrical object is rotated at a constant speed about its axis by Motor2 to expose the entire surface to the vapor in order to achieve uniform coating. The nanorods of the evaporated materials are deposited onto the sidewall of the cylindrical object uniformly as shown in FIG. 3(b). Below, the deposition of nanorod arrays on a cylindrical/tapered object for a number of typical situations are described.

Figure 4:
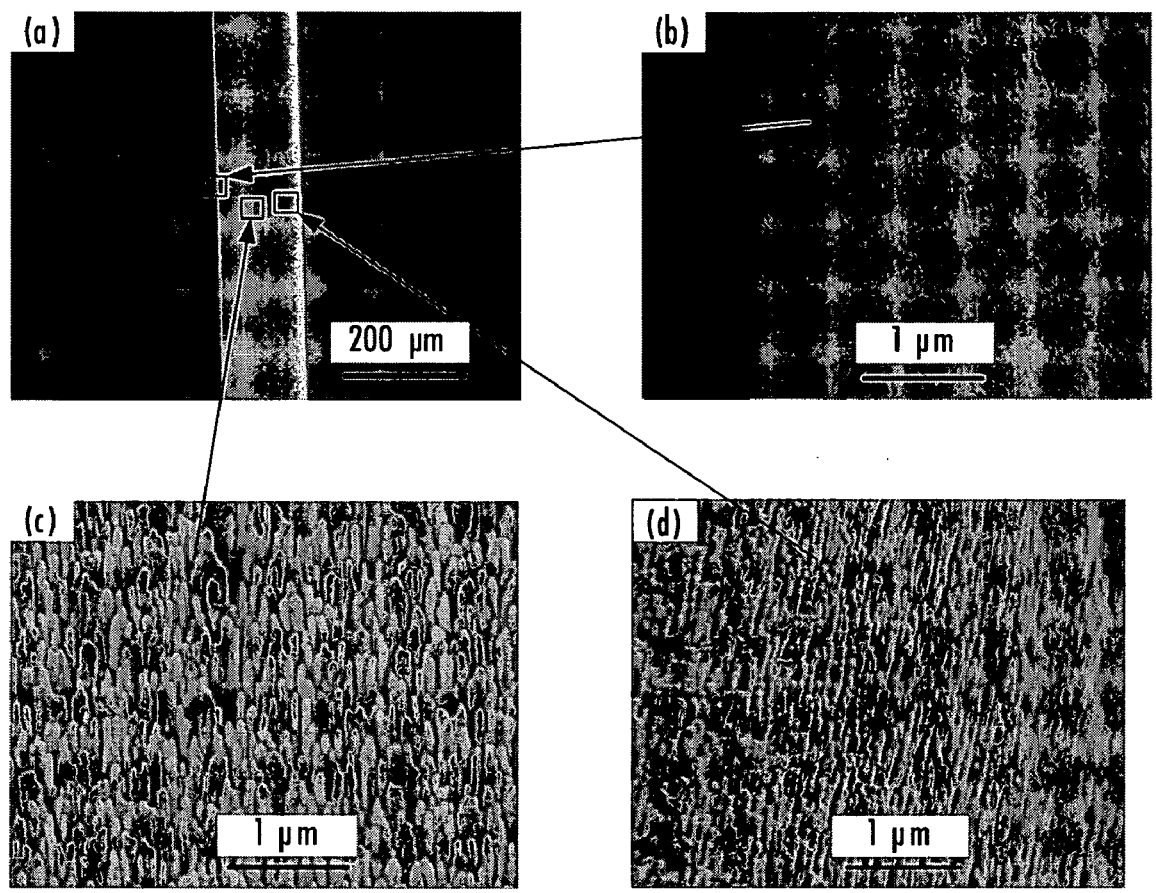
FIG. 4 illustrates aligned Ag nanorods formed on an optical fiber (a), (b), (c), and (d), are SEM pictures taken at three different portions on the fiber as indicated by (a). The diameter and separation of the nanorods are about 67±16 nm and 129±55 nm, respectively.

Nanorod on uniform cylindrical rods or fibers: Sensors such as SERS or SPR often require a roughened thin layer of metal film coating on solid substrates. FIG. 4(a) shows an example of directly depositing a Ag nanorod array onto an optical fiber (uniform rod) surface. A multimode optical fiber (Newport, part number F-MLD-500) with a cladding diameter of 140 μm and a buffer diameter of 500 μm was cut into 2" sections. Approximately ⅔ of the fiber section was immersed in acetone for 1 hr to remove the acrylate buffer layer and expose the cladding. The fiber was then mounted onto a pin vise coaxially, leaving the exposed cladding outside. The pin vise was attached to the axis of Motor2 inside an electron beam evaporation chamber (Torr International, Inc.). The nanorods were fabricated following the above mentioned procedures with θ=4°. Motor2 was rotated at a rotation speed of 0.05 rev/sec, and the Ag deposition rate was 0.2 nm/sec at a pressure of $1.0\times10^{-5}$ Torr. The deposition rate of the normal-grown film thickness was monitored by a quartz crystal microbalance, and the structure of the nanorods was examined by a field emission scanning electron microscope (FESEM: LEO 982). FIG. 4(a) shows the optical fiber coated with Ag nanorods. The close-up view of the fiber, FIG. 4 (c) reveals the details of the nanorod structures; all rods were aligned with the deposition direction at a certain angle. The nanorods were coated all around the fiber, which was confirmed by FIGS. 4(b) and (d) (since the two SEM images were taken at the edge of the curved surface, parts of the pictures looked fuzzy due to the lack of focus of the electron beam). The Ag rod diameter was estimated to be about 67±16 nm, and the separation was about 129±55 nm. There were no notable changes when the rotation speed of the fiber was changed from about 0.5 to 5 rev/sec.

Figure 5:
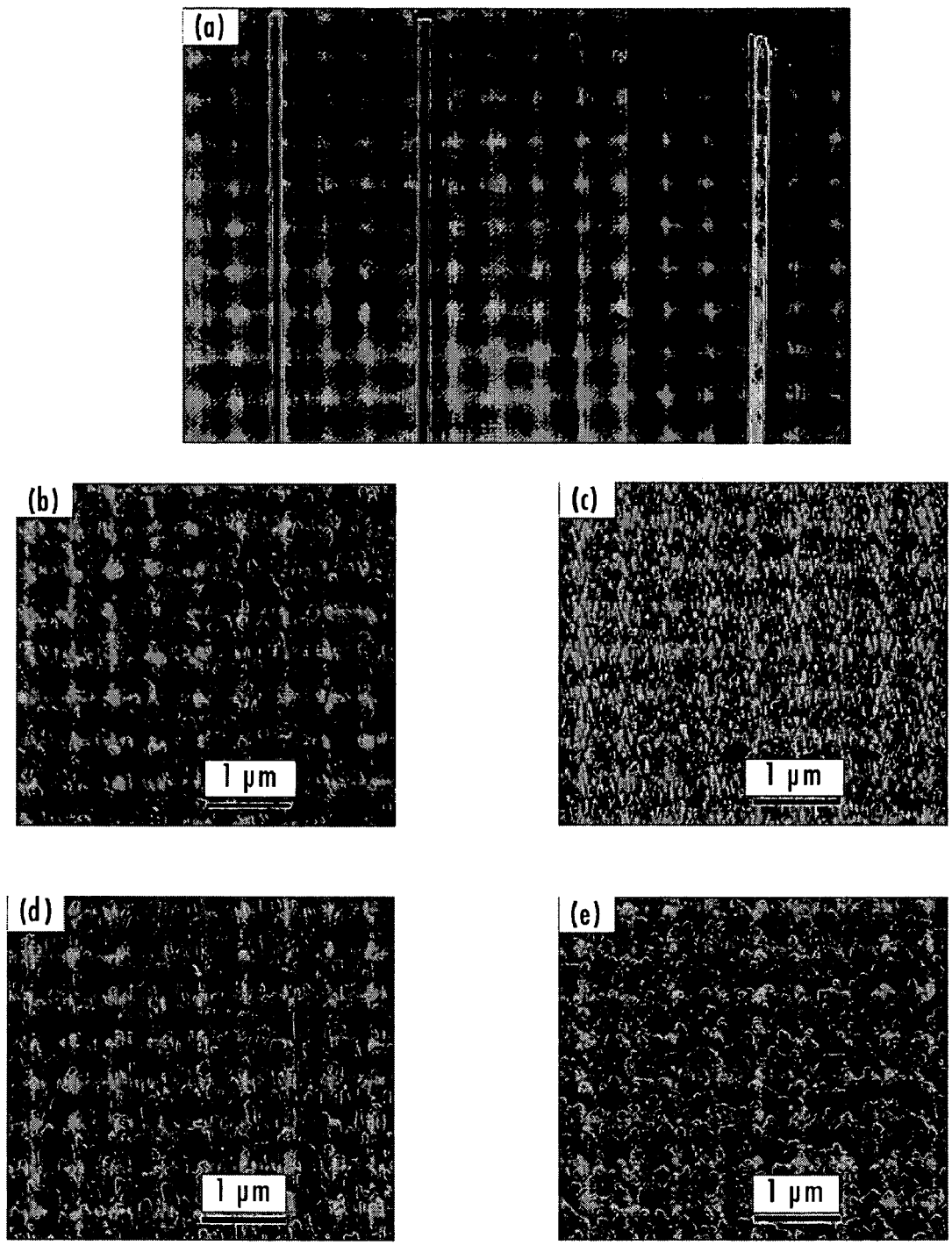
FIG. 5 illustrates the Al, Ni, Si and TiO$_2$ (from left to right) nanorod coated fibers. The fibers have different colors (a), and the detailed morphologies are shown for (b) Al, (c) Ni, (d) Si, and (e) TiO$_2$, nanorod coated fibers.

In addition to Ag, other materials can also be deposited onto the optical fiber, such as, Si, Cu, Al, Ni, and $TiO_2$. The growth conditions for these materials were the same as those for Ag nanorods as described above: θ=4°, fiber rotation speed ω=0.05 rev/sec, growth rate r=0.2 nm/sec, and normal reference thickness d=1 μm (for $TiO_2$ growth, there was a $4\times10^{-4}$ Torr back-filled $O_2$ atmosphere to the PVD chamber). The optical fibers coated with different materials resulted in different colors as shown in FIG. 5 (a): black for Al and Ni, yellow for Si, and white for $TiO_2$. The SEM pictures of the optical fibers are shown in FIGS. 5 (b)-(e) for Al, Ni, Si, and $TiO_2$, respectively. Aligned arrays of nanorods were observed from all the optical fibers. However, the detailed morphologies seemed to be different for different materials: island-like structures, rather than nanorods, were formed on Al coated fiber; nanorod arrays were formed on Ni coated fiber, which was similar to that of Ag coated fiber; and laminated structures and bundled rods structure were found on Si and $TiO_2$ coated fibers, respectively. The difference may be attributed to the different diffusion constants for each material.

Figure 6:
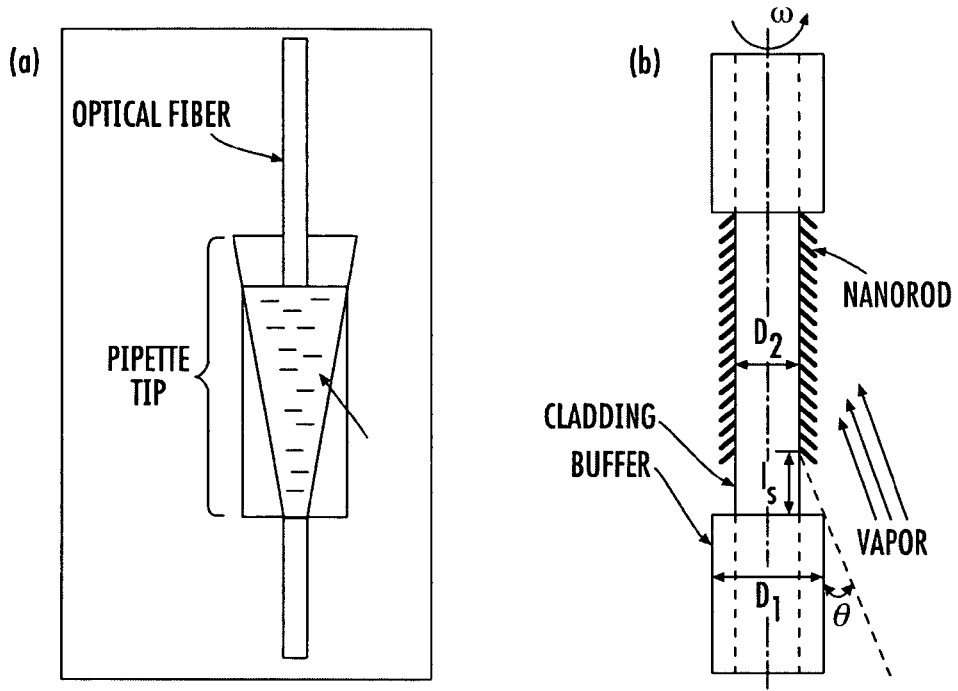
FIG. 6 illustrates: (a) a schematic showing how to open a window in an optical fiber, (b) nanorods formed on the window, with length l$_s$ shadowed by the buffer layer, (c) a "window" on the fiber after deposition of Ag nanorods, and (d) a SEM picture of the Ag nanorods coated on it. The diameter and separation of the nanorods are about 46±7 nm and about 111±26 nm, respectively.
Figure 6:
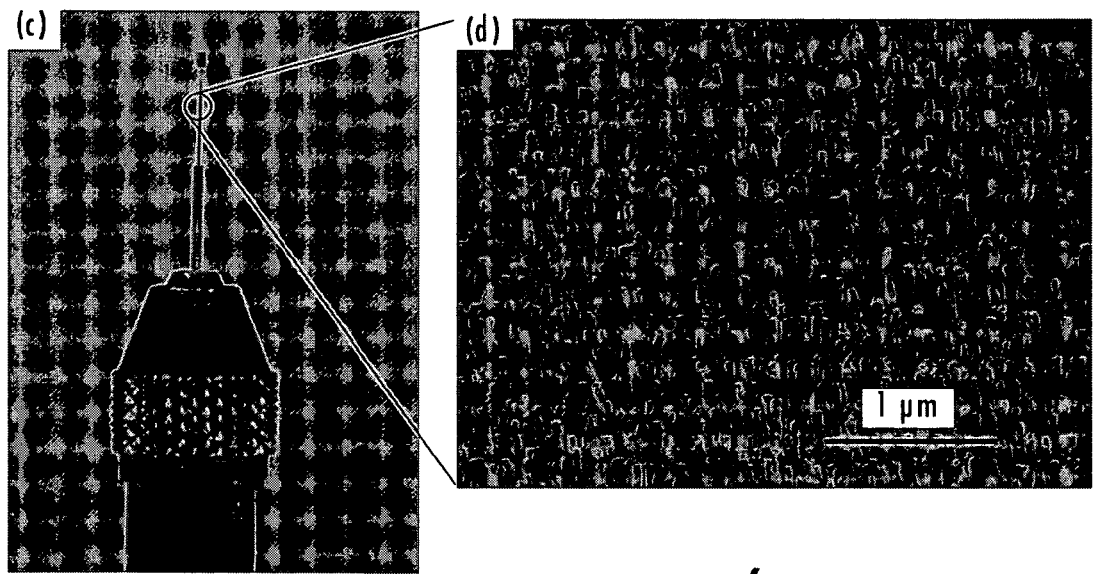

Nanorods on a small section of optical fiber: For applications such as absorption based sensors or SPR sensors, it is required to coat a small section of the optical fiber with nanostructures of different optical properties. To do this, first it is necessary to remove the buffer and cladding layer from a small section of a fiber to expose the core. This can be achieved using a pipette tip. An optical fiber is inserted into a pipette tip as shown in FIG. 6(a), with a tip size similar to (or cut to fit) the fiber diameter. The pipette tip is filled with acetone, and both ends are sealed with tapes. After one hour, the buffer layer inside the tip becomes soft and loose, and thus can be easily removed. Then the deposition procedure is similar to what has been described above. Note that, due to the shadowing from the buffer layer, part of the window section will not be deposited with the nanorods (See FIGS. 6 (b) and (c)). The geometrical shadowing length, $l_s$, is determined by the buffer layer thickness Δ, as well as the vapor incident angle θ with respect to the axis of the fiber:

$$l_s = \frac{\Delta}{\tan\theta} = \frac{D_1 - D_2}{2\tan\theta},$$

where $D_1$ and $D_2$ are the diameters of the fiber buffer and cladding, respectively. In order to eliminate this part, one can rotate the fiber so that the axis of the fiber is perpendicular to the incoming vapor direction, mask the nanorods section with a shadow mask, then coat the fiber with a layer of uniform Ag thin film. FIG. 6(c) shows the window section opened in a fiber where a light colored part is the shadowed section. FIG. 6 (d) shows the Ag nanorods coated successfully inside the window section. The nanorod diameter was 46±7 nm and the separation was 111±26 mn.

Figure 7:
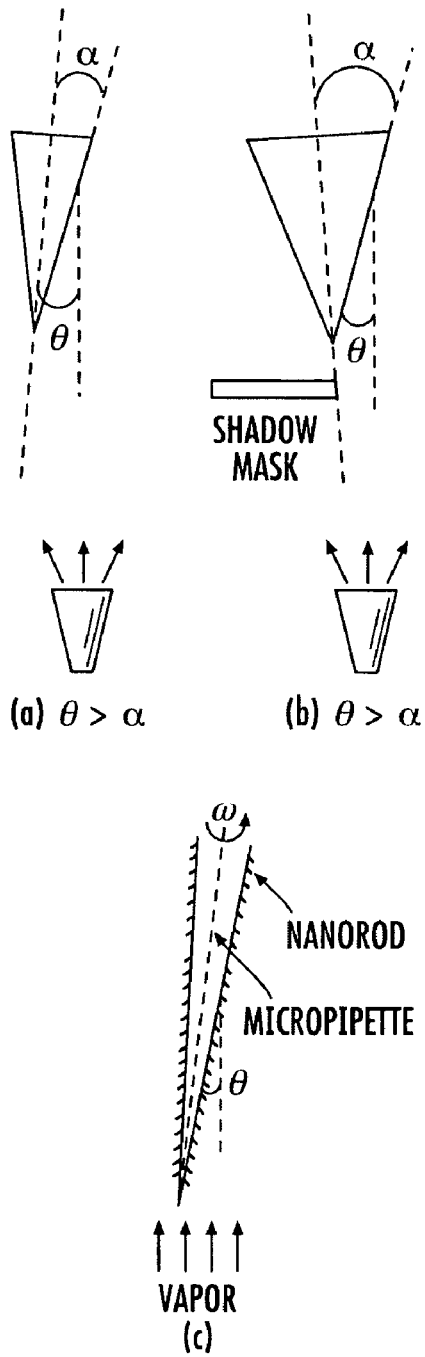
FIG. 7 illustrates the deposition arrangement for tapered rods where (a) $\theta$>$\alpha$ and (b) $\theta$<$\alpha$, and (b) further illustrates where a substrate mask is used to shadow the vapor from arriving at the other side of the tapered surface.

Nanorod on tapered fibers: For SPR sensors, the resonance wavelength usually depends on the incident angle as well as the reflection angles. In this portion, a way to coat nanorods onto the tapered fiber surface is described. FIGS. 7 (a) and (b) show that two possible situations could occur when using the modified OAD to coat the aligned nanorod arrays. First, if the tapered rod has a tapered angle α (FIG. 7(a)) smaller than the desired deposition angle θ (the angle of the tapered fiber surface with respect to the evaporation beam direction, see FIG. 7 (a)), one can rotate the rod to a polar angle of θ−α with respect to the vapor beam direction. The rest of the fabrication procedures are the same as those described previously. However, when θ−α<0 (θ<α), as shown in FIG. 7(b), in order to make one outside wall create a small enough angle θ for the incoming vapor, the other side of the fiber is exposed to vapor at a relatively large angle. This is not desirable for an aligned nanorod coating. In order to overcome this drawback, one should put a mask above the evaporation source in order to prevent the other side of the fiber from being "seen" by the vapor as shown in FIG. 7(b). FIG. 7 (c) shows the expected nanorod array coated on the tapered surface.

Figure 8:
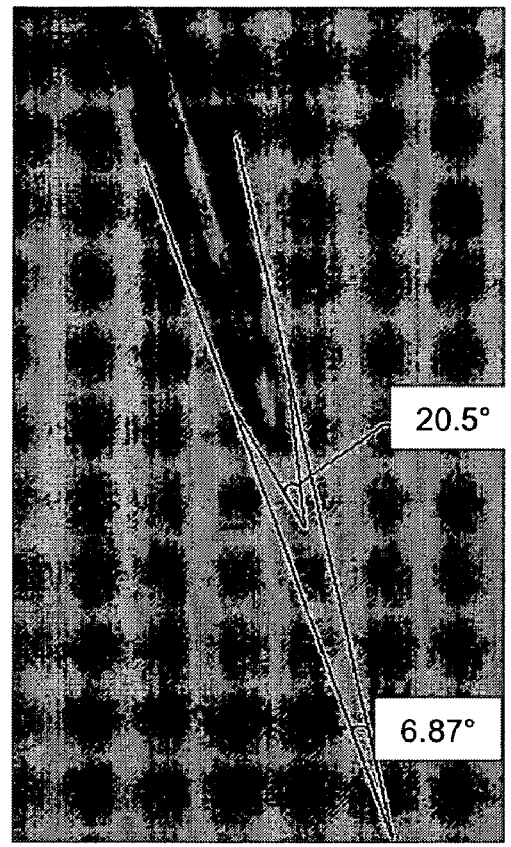
FIG. 8 illustrates an optical micrograph of the micropipette tip used in an experiment. The tip has doubly tapered angles.
Figure 9:
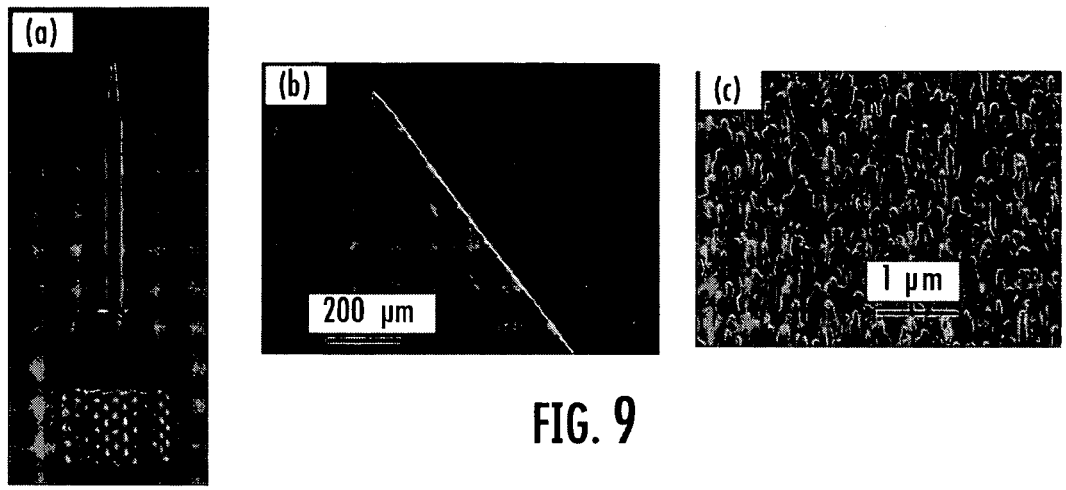
FIG. 9 illustrates Ag nanorods deposited onto taped micropipette tip: (a) micropipette tip mounted on a pin vise after deposition, (b) zoom into the tip and, (c) SEM of the nanorod array. The diameter of the rod is about 60±13 nm, and the rod-rod separation is about 141±43 nm.

In order to test this idea, tapered micropipette tips were prepared by a micropipette puller (Sutter Instrument Co.). The glass capillary tube used had 1 mm OD and 0.6 mm ID. By controlling the pulling speed, micropipettes with different tapered angles can be achieved. The tapered angle can be measured with an optical microscope. FIG. 8 shows one example of a micropipette tip used in the experiment. There were two tapered sections on the tip, but we only considered the longer section, which had a tapered angle, $2\theta=6.87°$. During the deposition, the axis of the pipette tip was rotated to a polar angle about $0.57°$ with respect to the vapor beam direction, so that the angle between the surface tangent of the slanted surface and the vapor beam direction was $4°$. FIG. 9 shows the resulting Ag nanorod array deposited onto the tapered micropipette tip, in which the nanorod size was measured to be $60\pm13$ nm and nanorod-nanorod separation was $141\pm43$ nm. These parameters are quite close to the situation of coating on a uniform optical fiber (FIG. 4). This result has demonstrated that the modified OAD method is versatile enough to coat nanorods onto tapered objects, as long as one can obtain the tapered angle and the initial surface of the object is smooth.

Multilayer structures: For SERS or other multifunctional sensor applications, it is also desirable to put multilayered structures onto optical fibers. For example, one can either first coat a thin film on the fiber (including uniform rods and tapered rods), then coat the film with the aligned nanorods, and/or one can coat a layer of nanorods from material A, and then coat a second layer of nanorods from material B. By slightly modifying the procedure proposed earlier, one can easily achieve these structures during deposition.

Figure 10A:
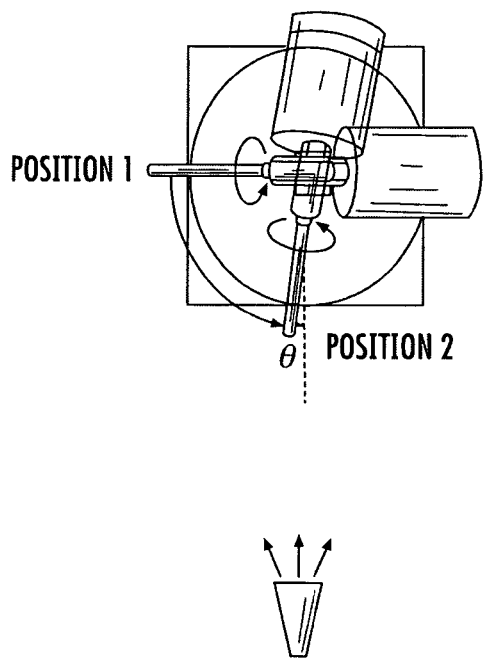
FIG. 10(a) illustrates the deposition procedure for multi-layered film/nanorod structures on cylindrical objects: at position 1, the axis of the fiber is horizontal and a layer of thin film can be deposited on the surface; and at position 2, after thin film deposition the fiber is tilted off the vapor direction to deposit nanorods.
Figure 10B:
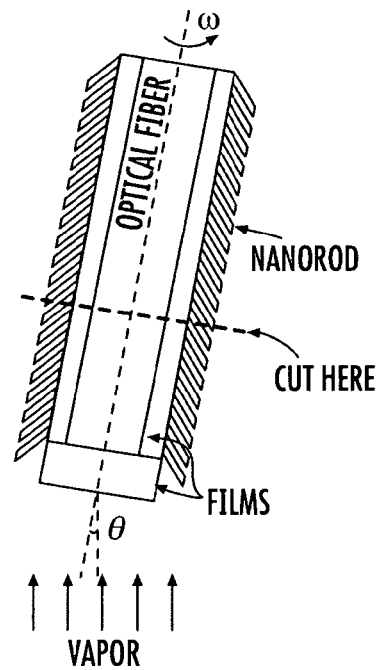
FIG. 10(*b*) illustrates a diagram of the nanorod/film multilayer structure.
Figure 11:
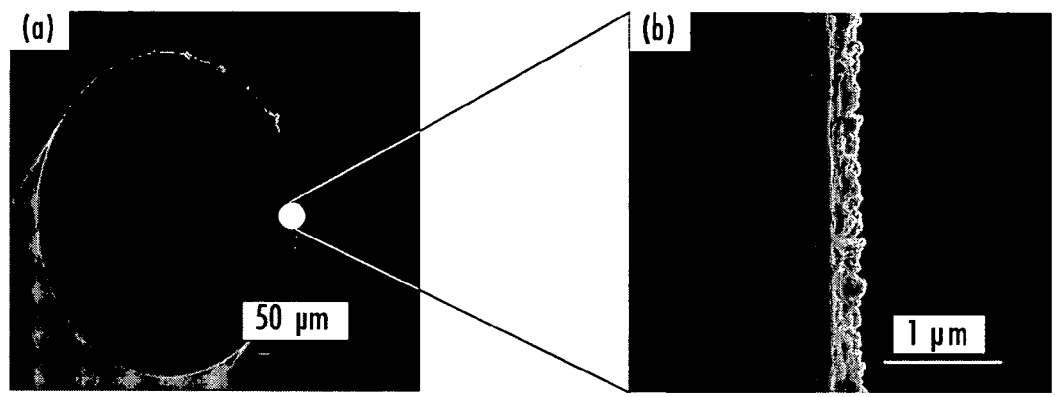
FIG. 11 illustrates (*a*) the cross section of the optical fiber, (*b*) a SEM picture taken at the edge of the fiber cross-section showing layers of film and rods, and (*c*) a SEM on the side wall of the optical fiber showing the top-view nanorod structure.

In order to deposit nanorod/thin film structures onto a fiber, a two-step procedure as illustrated in FIG. 10 (a) is used. First, to deposit a layer of thin film onto the fiber, the fiber is rotated by Motor1 to Position1 so that the axis of the fiber is perpendicular to the incoming vapor direction. Then a uniform layer of thin film can be coated onto the fiber by continuously rotating the fiber about its axis using Motor2. In this case, if total normal thickness d of the deposition is monitored by a thickness monitor in the deposition chamber, the thickness t of the film on the fiber can be estimated as:

$$t = \frac{d \int_{-\frac{\pi}{2}}^{\frac{\pi}{2}} \cos\theta S(\theta) d\theta}{2\pi}, \quad (1)$$

where $\theta$ is the angle between the arriving atoms and the surface normal and $S(\theta)$ is the sticking coefficient of atoms adsorbing on the cylindrical surface, which usually depends on many factors such as the energy and incident angle of the atoms. The t takes a simplified form $t=d/\pi$, when S equals unity. After reaching the desired thickness with the desired material (note: the materials for the film and nanorod may be, but do not have to be, the same), the fiber is rotated to Position2 as shown in FIG. 10 (a), so that the axis of the fiber forms an angle $\theta$ with respect to the incoming vapor beam. With this configuration, a layer of desired nanorods can be deposited. The expected structure is shown in FIG. 10 (b). FIG. 11 shows an example of Ag nanorod/Ag film structure, with a normal thickness 1.5 μm of Ag film for both layers. As shown in the cross-section SEM image of the fiber, FIG. 11 (b), the interface of the two layers (film and nanorod) is very clear. However, here, one can not tell the detailed structure of the nanorods due to the way the fiber is cut (as indicated by the dotted line in FIG. 10 (b)). The nanorod structure of the top layer was confirmed by the top-view SEM image shown in FIG. 11 (c). Surprisingly, the thickness of the Ag film was measured to be $159\pm11$ nm (here we ignored the fact that the fiber cross section was tilted at a small angle as seen from the SEM picture), which was much smaller than the 477 nm predicted from $t=d/\pi$. This suggests that the effective sticking coefficient S is much smaller than unity. Equation (1) shows that angular dependent sticking coefficient plays an important role in the film thickness, which is in agreement with current theory and experiments. Therefore, this approach is adopted here to qualitatively explain the effect of incident angle on the sticking coefficient. In the literature, the sticking coefficient versus incident angle curves at different ion energies can be fitted very well using a modified Gaussian equation $$S(\theta) = y_0 + \frac{A}{t_0} e^{\frac{1}{2}\left(\frac{w}{t_0}\right)^2 \frac{\theta-\theta_c}{t_0}} \int_{-\infty}^{z} \frac{1}{\sqrt{2\pi}} e^{-\frac{y^2}{2}} dy, \quad (2)$$

where $$z = \frac{\theta-\theta_c}{w} - \frac{w}{t_0}$$

and $y_0$, A, w, $t_0$, $\theta_c$ are fitting parameters that can be determined for each curve. So far, one can numerically solve Eq. (1) regarding film thickness t for a cylindrical surface. Here a thickness reduction factor, γ, is introduced and is defined as the ratio of t calculated from the above equations and $t=d/\pi$. For different incident ion energies, the lowest γ value obtained was 0.72. Thus, the sticking coefficient could play an important role during the Ag film deposition.

Figure 12:
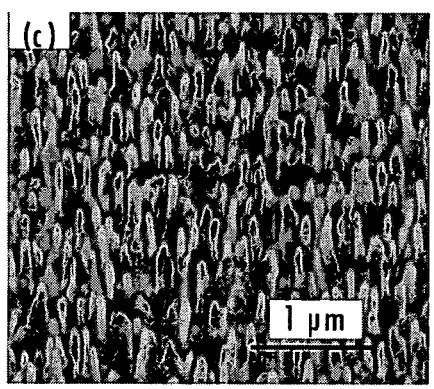
FIG. 12 illustrates a SEM picture of the Ag nanorods/Si nanorods/Si wafer multilayer structure. The arrows point to several typical layer-layer junctions.
Figure 12:
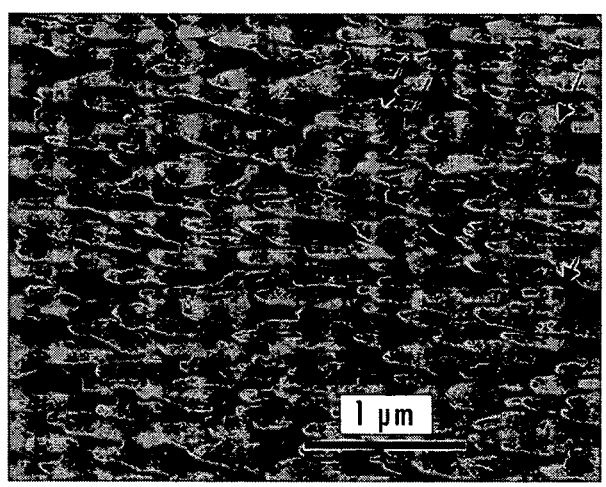

To achieve a two-layered nanorod structure on the fiber, one can perform two consecutive nanorod depositions with different materials (after one deposition, one needs to switch the source material). FIG. 12 shows the top-view structure of Ag nanorods/Si nanorods on an optical fiber. The junctions of the Ag and Si nanorods were very clear as pointed out by the arrows in FIG. 12. Both layers of Si and Ag were grown at the same conditions: $\theta=4°$, and the normal thickness was 1 μm.

Coating aligned nanorods in the inner surface of a tube: Using the setup in FIG. 3, part of the inner surface of a cylindrical tube can be deposited by the aligned nanorod array. FIG. 13 shows the deposition geometry (FIG. 13(a)) and the resulting structure (FIG. 13 (b)). Assuming the diameter of the tube is D, the tilting angle is $\theta$, then the depth h of the inner tube that can be covered by the nanorod array is defined by the following equation:

$$h = \frac{D}{\tan\theta}$$

For this case, the incident angle $\theta \leq 10°$.

Coating aligned nanorods on irregular shaped cylinder: Using the setup in FIG. 3, the lower parts of the cylinder can be deposited by the aligned nanorod array. As shown in FIG. 14, the deposition configuration (FIG. 14 (a)) and the resulting coating (FIG. 14(b)). For this case, the incident angle $\theta \leq 10°$.

Figure 15A:
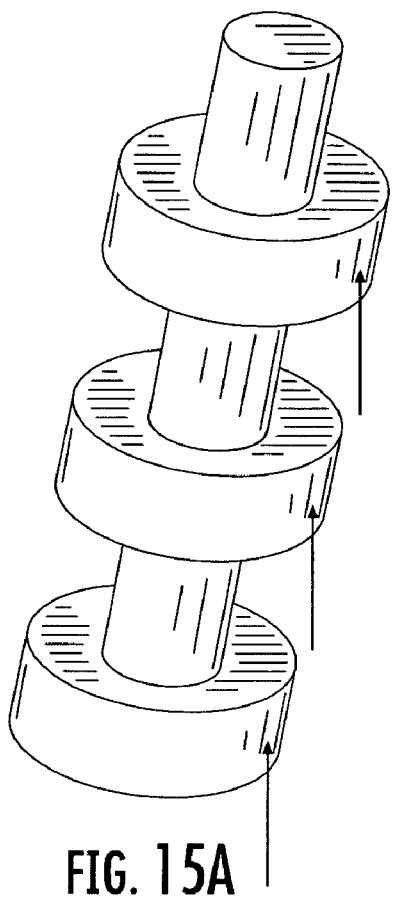
FIG. 15 illustrates coated aligned nanorods on periodic shaped cylinder: (*a*) the periodic shaped cylinder and the deposition configuration; (*b*) the illustration of the coating results. The shaded parts are thin film coatings.
Figure 15B:
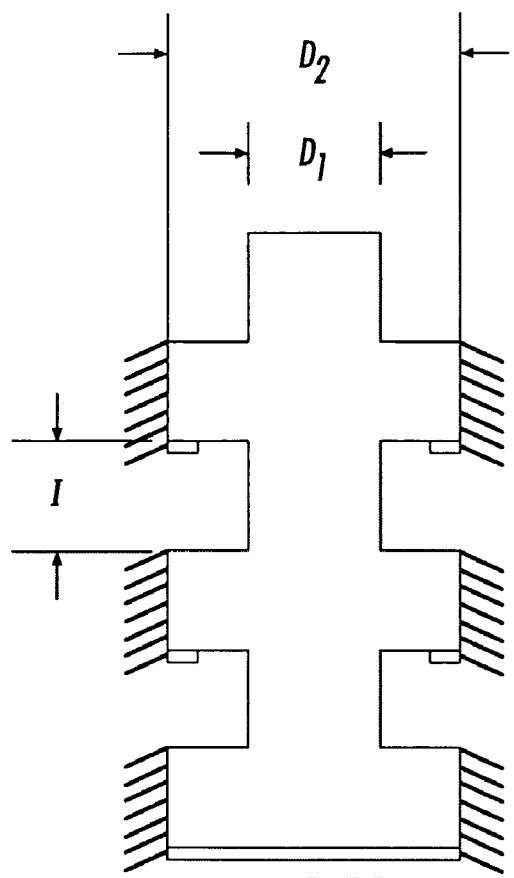

Coating aligned nanorods on periodic shaped cylinder: Using the setup in FIG. 3, all the protruded cylindrical surfaces can be deposited by the aligned nanorod array. FIG. 15 illustrates the deposition configuration (FIG. 15(a)) and the resulting coating (FIG. 15(b)). There are a thin layer of continuous thin film coatings on the front surfaces, and rings of thin film coating on the inner surfaces. The incident angle is defined by the geometry of the structure.

$$\theta \le \arctan\frac{D_2 - D_1}{2l}$$

Figure 16A:
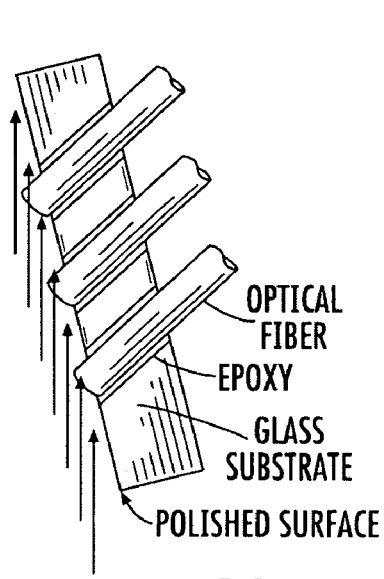
FIG. 16 illustrates coated aligned nanorods on the tip surface of an optical fiber: (*a*) deposition geometry, optical fibers are glued onto glass slides and polished; and (*b*) the nanorod array on the tip surface.
Figure 16B:
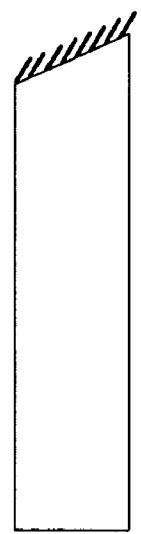
Figure 17:
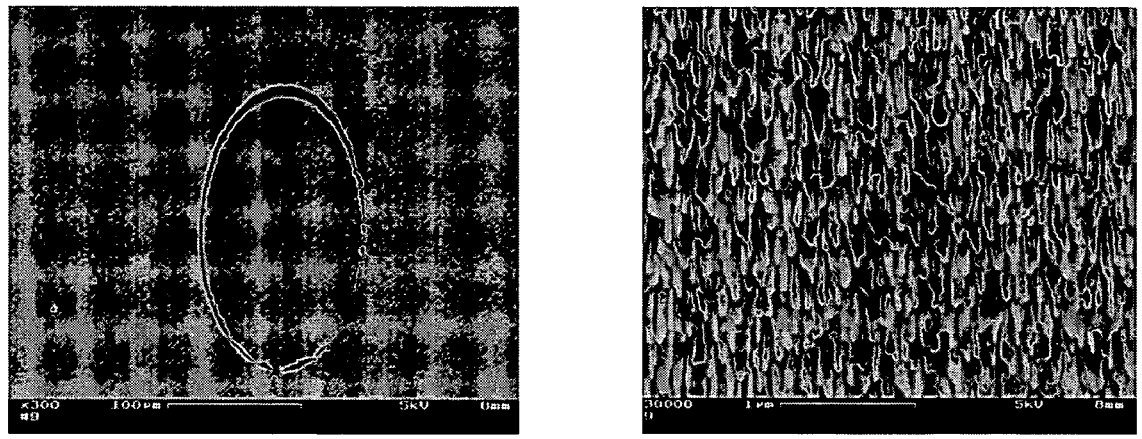
FIG. 17 illustrates a Ag nanorod array deposited on the tip of an optical fiber: (*a*) fiber surface embedded in the glass, and (*b*) coated with Ag nanorod array.

Coating aligned nanorods on the tip surface of an optical fiber: The optical fibers are first fixed to the glass slides by expoxy, then the entire surface of the glass and optical fibers are polished till the fiber surface is flat with the glass surface. Then the entire structure will be mounted on to the motor stage with a small incident angle as shown in FIG. 16(a). FIG. 17 illustrates a Ag nanorod array deposited on the tip of an optical fiber where (a) shows a fiber surface embedded in the glass, and (b) shows a fiber surface coated with Ag nanorod array.

CONCLUSION

In summary, a simple and robust way to fabricate aligned nanorod arrays onto different cylindrical objects with different structures has been demonstrated. This technique is a physical vapor deposition based method. From experiments mentioned above, one can conclude that this modified oblique angle deposition technique has the following unique features: (1) there is almost no limit in the material used (as long as the material can be physically vaporized, one can deposit uniform, aligned nanorods onto a cylindrical object); (2) the coated nanorods are well aligned and separated from each other, and the coating is statistically uniform and reproducible; (3) the size, density and morphology of the nanorod arrays can be tuned by the vapor incident angle; (4) using multiple sources or varying the rotation mechanisms, multi-layered structures, such as hetero-junction nanorod arrays or thin film-nanorods, can be designed and fabricated; (5) all of the nanorod arrays can be grown at low temperature; and (6) the fabrication process is compatible with current microfabrication techniques. With the versatility of this fabrication method and the many advantages of nanorod structures, such as high surface area and good reproducibility, one can fabricate more complicated fiber probes, which cannot be done by other technologies, and can optimize the sensitivity and specificity. This technique can also be used as a general nano-coating technique for cylindrical object coating in applications such as self-decontaminated surfaces, tissue engineering, and the like.

The invention claimed is:

1. A structure, comprising:
a substrate having a non-planar surface, wherein the non-planar surface is selected from the group consisting of: a conical surface, a tapered surface, and a cylindrical surface, wherein a portion of the non-planar surface has at least one layer of nanostructures disposed thereon, wherein an angle, β, is formed between the nanostructures and the substrate, wherein the angle is about 30° to 70°, wherein the substrate is a symmetrical structure having one center axis of rotation, and wherein the nanostructures have a length of about 10 nanometers (nm) to 5000 nm.

2. The structure of claim 1, wherein the nanostructures comprise a uniform array of nanostructures.

3. The structure of claim 2, wherein the nanostructure comprise a nanorod.

4. The structure of claim 3, wherein the nanorod has a length of about 10 nm to 1000 nm.

5. The structure of claim 3, wherein the nanorod has a length of about 10 nm to 100 nm.

6. The structure of claim 3, wherein the nanorod has a diameter of about 10 to 200 nm.

7. The structure of claim 3, wherein the nanorod is about 20 to 200 nm from one another.

8. The structure of claim 1, wherein the non-planar surface includes a tapered cylindrical surface.

9. The structure of claim 1, wherein the substrate includes a cylindrical ringed substrate having a cylindrical surface base and at least one symmetrical cylindrical ring extending from the central axis of rotation of the substrate.

10. The structure of claim 1, wherein a layer of nanostructures is disposed on a portion of the end of the substrate.

11. The structure of claim 1, wherein the nanostructure is selected from one of the following materials: a metal, a metal oxide, a metal nitride, a metal oxynitride, a polymer, a multicomponent material, and combinations thereof.

12. The structure of claim 1, wherein the nanostructure is selected from one of the following: silver, nickel, aluminum, silicon, gold, platinum, palladium, titanium, cobalt, copper, zinc, oxides of each, nitrides of each, oxynitrides of each, and combinations thereof.

13. The structure of claim 1, wherein the nanostructure includes multiple layers of materials.

14. The structure of claim 13, wherein each layer is a different material.

15. The structure of claim 14, wherein the material is selected from one of the following materials: a metal, a metal oxide, a metal nitride, and a metal oxynitride.

16. The structure of claim 1, wherein the substrate is an optical fiber.

17. The structure of claim 1, wherein the nanostructure includes three layers, and the three layers form a zig-zag structure.

18. The structure of claim 17, wherein the three layers include two different materials.

19. The structure of claim 1, further comprising a layer of material disposed on the non-planar surface, and wherein the nanostructure includes three layers and the three layers form a zig-zag structure.

20. The structure of claim 19, wherein the three layers include two different materials.

* * * * *